United States Patent [19]
Kenmoku et al.

[11] Patent Number: 5,757,811
[45] Date of Patent: May 26, 1998

[54] SYSTEM FOR TESTING A FAULT DETECTING MEANS

[75] Inventors: Kazuo Kenmoku; Shigeo Tominaga; Yukio Hirano; Norio Kanno, all of Tokyo, Japan

[73] Assignee: Mitsubishi Denki Kabushiki Kaisha, Tokyo, Japan

[21] Appl. No.: 779,256

[22] Filed: Jan. 3, 1997

[30] Foreign Application Priority Data

Jan. 10, 1996 [JP] Japan ................................ 8-002309

[51] Int. Cl.[6] ........................................... G06F 11/00
[52] U.S. Cl. ................................................ 371/3
[58] Field of Search ............................ 371/3, 5.1, 5.4, 371/10.1, 22.1, 22.36; 395/182.01

[56] References Cited

U.S. PATENT DOCUMENTS 5,627,969   5/1997   Kobayashi et al. ............... 395/200
5,642,359   6/1997   Nassehi ................................ 395/182

FOREIGN PATENT DOCUMENTS 3-292539   12/1991   Japan.
6-88861    3/1994    Japan.

Primary Examiner—Vincent P. Canney
Attorney, Agent, or Firm—Wolf, Greenfield & Sacks, P.C.

[57] ABSTRACT

The invention provides a test system of a fault detecting means, in which, during a normal operation, a fault forcibly generating circuit lets a transmission path signal inputted from the outside pass through as it is, generates a test signal which is the same as that of the transmission path signal, and outputs it to a fault detecting circuit. During a time of testing, the fault forcibly generating circuit outputs "Low" level of the test signal forcibly to the fault detecting circuit, according to a test control signal outputted from a control portion. When the fault detecting circuit detects this test signal, an step-out alarm is generated and transmitted to the control portion. The control portion monitors the step-out alarm from the fault detecting circuit. The control portion judges the operation to be normal if the step-out alarm is outputted, and to be abnormal if the step-out alarm is not outputted under the condition that the step-out alarm is not outputted at the time of non-testing.

9 Claims, 8 Drawing Sheets

1

SYSTEM FOR TESTING A FAULT DETECTING MEANS

BACKGROUND OF THE INVENTION

1. Field of the Invention

The present invention relates to a test system of a fault detecting means which detects faults of an input signal and faults of operations of an apparatus.

2. Description of the Prior Art

FIG. 8 shows a conventional construction of a fault detecting circuit test system for testing operation of a fault detecting circuit which detects the fault of an input signal. In FIG. 8, the test system comprises a transmission path terminating device 1, a fault detecting circuit 3 arranged in the transmission path terminating device 1, a no clock detecting circuit 18 arranged in the transmission path terminating device 1, a clock supply board 19 arranged in the transmission path terminating device 1 for supplying a clock, a clock 20 supplied from the clock supply board 19 to the no clock detecting circuit 18, a test signal generating apparatus 43 and a test signal 44 supplied to the fault detecting circuit 3 from the test signal generating apparatus 43.

Next, an operation of the fault detecting circuit test system shown in FIG. 8 is explained below. In order to carry out operation test of the fault detecting circuit 3 in the transmission path terminating device 1, the test signal generating apparatus 43 generates and transmits the test signal 44 to the transmission path terminating device 1. A fault state signal is inserted into the test signal 44 at the test signal generating apparatus 43. Then, the state of fault detection of the fault detecting circuit 3 at that time is monitored.

In case of testing the operation of the no clock detecting circuit 18 which detects existence of fault of the clock 20 inputted from a clock supply board 19, the clock 20 inputted into the no clock detecting circuit 18 is forcefully isolated by drawing out of the clock supply board 19. Then, the state of the fault detection of the no clock detecting circuit 18 at that time is monitored.

In the conventional fault detecting circuit test system as described above, the test signal generating apparatus 43 is required to be connected to a test apparatus in order to insert fault state signal into the test signal. Therefore, the conventional system has a problem of requiring a large-scale test signal generating apparatus which generates various kinds of signal patterns. Also in the conventional system, the clock signal is actually cut off by removing the packaging board in the apparatus which operates the fault detecting circuit, and thereby the detecting state is monitored. Therefore, it is difficult to test the fault detecting circuit without affecting actual operation and operating state.

It is an object of the present invention to provide a system for testing an operating state of the fault detecting circuit by inserting fault state signal generated by a fault forcibly generating circuit into test signals which is sent forcibly to the fault detecting circuit.

It is another object of the present invention to provide a system for testing an operating state of the fault detecting circuit without using a large-scale test signal generating apparatus.

It is further object of the present invention to provide a system for testing an operating state of the fault detecting circuit without affecting actual operating state.

It is further object of the present invention to provide a system for testing an operating state of the fault detecting circuit which carries out a test without increasing the physical number of control signal lines and monitoring signal lines between the control portion used for the test control and monitoring and the test boards, even though the test points increase.

It is further object of the present invention to provide a system for testing an operating state of the fault detecting circuit which is able to reduce a scale of the test system.

It is further object of the present invention to provide a system for testing an operating state of the fault detecting circuit which is possible to carry out a test of a fault detecting means without directly controlling the test board having the fault detecting means.

SUMMARY OF THE INVENTION

According to one aspect of the present invention, a system for testing a fault detecting means for detecting faults of an input signal and faults of operations of an apparatus comprises: a control means for generating a test control signal, and a test board having the fault detecting means being tested; a fault forcibly generating means included in the test board for forcibly inserting fault information into a test signal inputted into the fault detecting means according to the test control signal; wherein the control means carries out a test of an operation of the fault detecting means by monitoring the detection results from the fault detecting means during inserting the fault information into the test signal.

According to another aspect of the present invention, the system for testing a fault detecting means, wherein the control means comprises a multiplexing means for multiplexing the test control signals and a demultiplexing means for demultiplexing multiplexed test results from the test board, and wherein the test board comprises a demultiplexing means for demultiplexing multiplexed test control signals from the control means and a multiplexing means for multiplexing test results from a plurality of fault detecting means.

According to further aspect of the present invention, the system for testing a fault detecting means further comprises a second fault forcibly generating circuit which prevents a clock to pass through and forcibly generates a fault signal during the test, a no clock detecting circuit for monitoring a state of the clock from the clock supply board and generating a no clock alarm signal when the clock stops.

According to further aspect of the present invention, the system for testing a fault detecting means for detecting faults of an input signal and faults of operations of an apparatus comprises: a control means for generating a test control signal, and a test board having the fault detecting means for being tested; and a test control objective board having a fault forcibly generating means which forcibly inserts fault information into a test signal inputted to the fault detecting means according to the test control signal, wherein the control means carries out a test of an operation of the fault detecting means by monitoring the fault detection results from the fault detecting means during inserting forcibly the fault information into the test signal.

According to still further aspect of the present invention, the system for testing a fault detecting means, wherein the control means comprises a multiplexing means for multiplexing the test control signals and a demultiplexing means for demultiplexing multiplexed test results from the test board, the control objective board comprises a demultiplexing means for demultiplexing multiplexed test control signals from the control means, and the test board comprises a multiplexing means for multiplexing test results from a plurality of the fault detecting means.

Preferably the system for testing a fault detecting means comprises a testing apparatus including the control means which is provided outside of the test board including a fault detecting means.

DETAILED DESCRIPTION OF THE PREFERRED EMBODIMENTS

Embodiment 1

Figure 1:
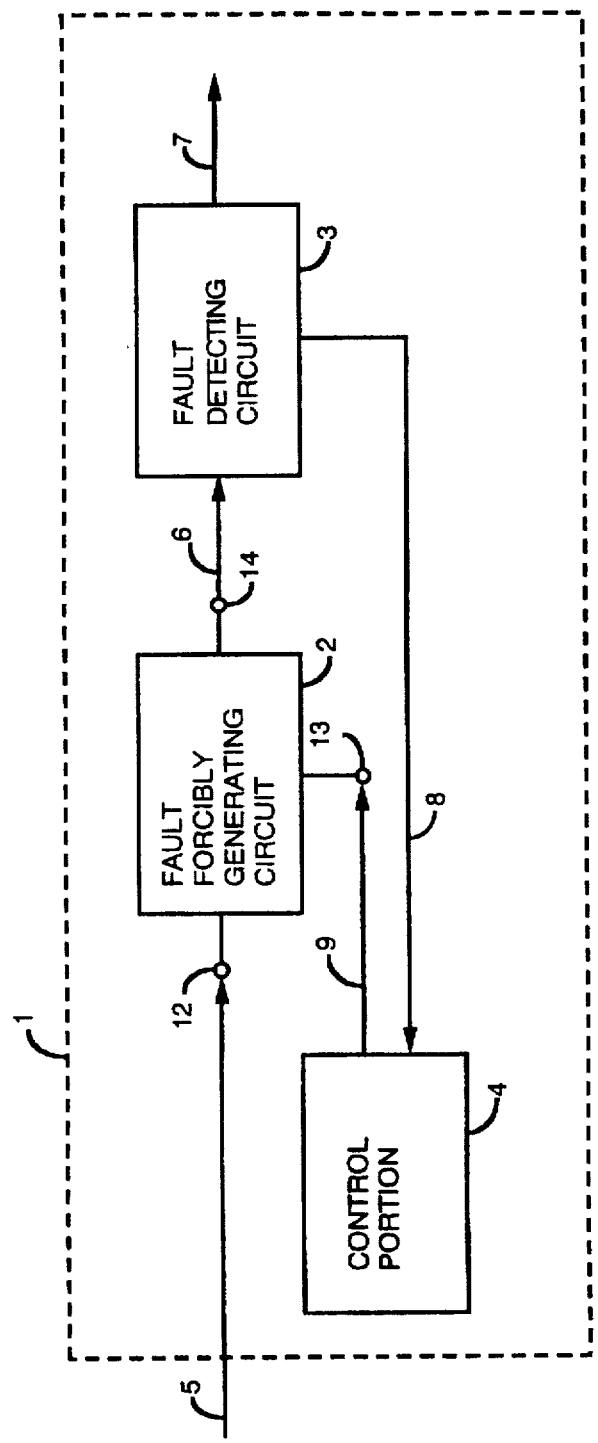
FIG. 1 is a construction of a transmission path terminating device showing one embodiment of the present invention.

FIG. 1 shows a construction of a transmission path terminating device in a first embodiment of the present invention. In FIG. 1, a transmission path terminating device 1 inputs a transmission path signal 5 and terminates the input signal. A construction of the transmission path terminating device 1 is explained below. The transmission path terminating device 1 comprises a fault forcibly generating circuit 2 for receiving the transmission path signal 5 and outputting a test signal 6, a fault detecting circuit 3 which synchronizes with this test signal 6, outputs an output signal 7 and generates a step-out alarm 8 when synchronization cannot be established because of existence of faults in the transmission path signal. The transmission path terminating device 1 further comprises a control portion 4 which outputs a test control signal 9 to the fault forcibly generating circuit 2 in order to insert faults forcibly from the fault forcibly generating circuit 2 into the transmission path signal 5, as well as monitors the step-out alarm 8. The transmission path terminating device 1 further comprises a test signal input terminal 12 of the fault forcibly generating circuit 2, a control input terminal 13 of the fault forcibly generating circuit 2 and a test signal output terminal 14 of the fault forcibly generating circuit 2.

Figure 2:
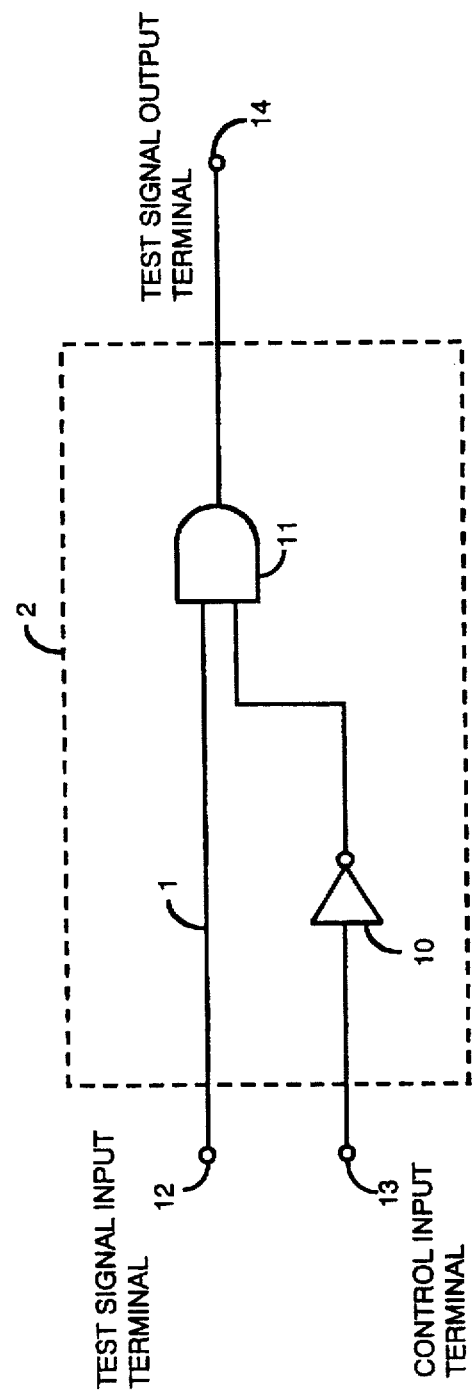
FIG. 2 is a circuit diagram of a fault forcibly generating circuit 2 shown in FIG. 1.

FIG. 2 is a circuit diagram of a fault forcibly generating circuit 2 shown in FIG. 1. Elements commonly numbered in FIG. 1 and FIG. 2 are not provided with a detailed explanation here. Those elements are described above in connection with FIG. 1. Accordingly the detailed explanation of the same portions is omitted. FIG. 2 comprises an invertor 10 and an AND gate 11.

Next, an operation of the transmission path terminating device 1 shown in FIG. 1 is explained below. In case of not testing the operation of the fault detecting circuit 3, the control portion 4 outputs an "L" (Low) level of the test control signal 9. Thereby the fault forcibly generating circuit 2 lets the inputted transmission path signal 5 pass through as it is to the fault detecting circuit 3. At this time, when the transmission path signal 5 is normal, the fault detecting circuit 3 establishes synchronization, and the step-out alarm 8 is not outputted. In case of testing the operation of the fault detecting circuit 3, the control portion 4 outputs an "H" (High) level of the test control signal 9. The fault forcibly generating circuit 2 forcibly fixes a test signal 6 to "L" level and outputs it to the fault detecting circuit 3.

Thereby, a synchronization pattern originally contained in the input transmission path signal 5 is destroyed. At this time, even if the fault detecting circuit 3 is operating normally, the synchronization can not be established, and the step-out alarm 8 is outputted. Therefore, the control portion 4 can carry out the operation test of the fault detecting circuit 3 by monitoring the step-out alarm 8 at the respective normal operation time and the test time. In other words, during a state of normal operation where the step-out alarm 8 is not outputted, it could be judged whether the operation of the fault detecting circuit 3 is normal or abnormal as below. That is the operation of the fault detecting circuit 3 is assumed normal if the step-out alarm 8 is outputted while the test is carried out, and the operation of the fault detecting circuit 3 is assumed abnormal if the step-out alarm 8 is not outputted while the test is carried out.

According to the first embodiment, test of a fault state detecting circuit can be carried out without requiring any large-scale test signal generating apparatus, and without affecting actual operating condition.

Embodiment 2

Figure 3:
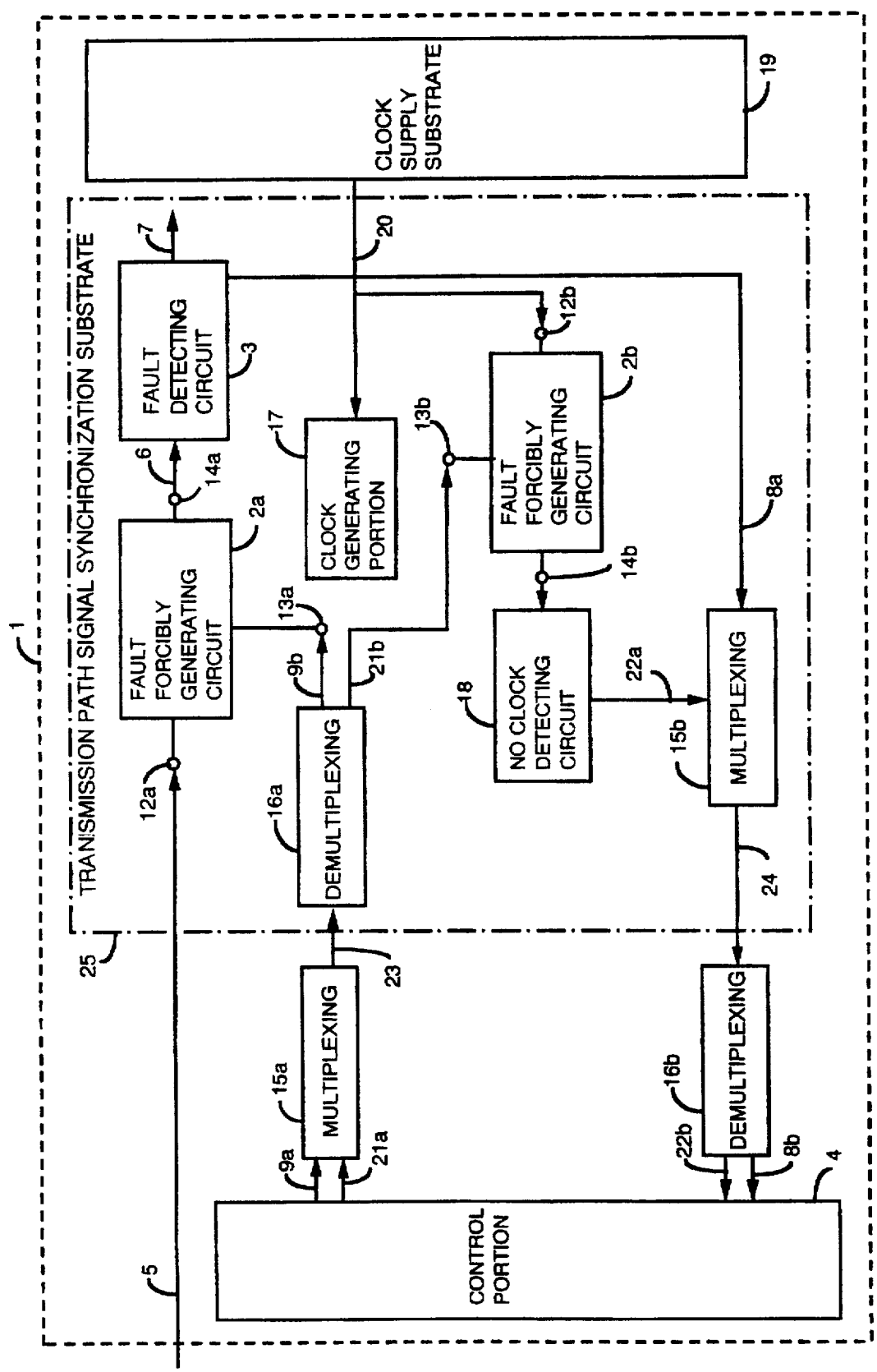
FIG. 3 is a construction of the transmission path terminating device showing another embodiment of the present invention.

FIG. 3 is a construction of a transmission path terminating device which shows a second embodiment of the present invention. In FIG. 3, the elements having the same reference numbers as those in FIG. 1 are the same portions or the corresponding portions. FIG. 3 comprises a clock supply board 19 arranged in a transmission path terminating device 1 and a transmission path signal synchronization board 25 which includes a fault detecting circuit 3 is arranged in the transmission path terminating device 1.

Next, a construction of the transmission path signal synchronization board 25 is explained below. The construction of the transmission path signal synchronization board 25 comprises a fault forcibly generating circuit 2a which prevents the transmission path signal 5 to pass through and forcibly generates a fault signal during the test, a fault forcibly generating circuit 2b which prevents the clock 20 to pass through and forcibly generates a fault during the test, a clock generating portion 17 which generates various kinds of clock according to the clock 20 inputted from the clock supply board 19 and a no clock detecting circuit 18 which monitors the state of the clock 20 from the clock supply board 19 and generates a no clock alarm signal 22a when the clock 20 stops.

The transmission path terminating device 1 also comprises a multiplexing circuit 15a which multiplexes a test control signal 9a and a no clock detecting circuit test control signal 21a. The test control signal 9a is a signal which is outputted from a control portion 4 to the synchronous circuit 3 and a no clock detecting circuit test control signal 21a is a signal which is outputted from the control portion 4 to the no clock detecting circuit 18. The multiplexed test control signal 23 is sent to a demultiplexing circuit 16a which is arranged in the transmission path signal synchronization board 25. The demultiplexing circuit 16a demultiplexes the above mentioned multiplexed test control signal 23 into a test control signal 9b sent to the fault forcibly generating circuit 2a and the no clock detecting circuit test control signal 21b sent to the fault forcibly generating circuit 2b.

The construction also comprises a multiplexing circuit 15b which is arranged on the transmission path signal synchronization board 25, and multiplexes an step-out alarm 8a received from the fault detecting circuit 3 and the no clock alarm signal 22a received from the no clock detecting circuit 18 to output them as a multiplexed alarm signal 24 to a demultiplexing circuit 16b. The demultiplexing circuit 16b is arranged in a transmission path terminating device 1, and demultiplexes the multiplexed alarm signal 24 into a step-out alarm 8b and a no clock alarm signal 22b to output them to the control portion 4.

Next, the transmission path terminating device shown in FIG. 3 is explained below. Since the operation of the testing operation of the fault detecting circuit 3 is similar to that of the first embodiment, the explanation is omitted. Here, an operation for testing the no clock detecting circuit 18 is explained.

In case of not testing the operation of the no clock detecting circuit 18, the control portion 4 outputs an "L" (Low) level of the no clock detecting circuit test control signal 21. Thereby, the fault forcibly generating circuit 2b lets the inputted clock 20 pass through as it is to the no clock detecting circuit 18. At this time, when the inputted clock 20 is normal, the no clock detecting circuit 18 judges the clock 20 to be normal and does not output the no clock alarm signal 22a.

In case of testing the operation of the no clock detecting circuit 18, the control portion 4 outputs the "H" level of the no clock detecting circuit test control signal 21b. Thereby, the fault forcibly generating circuit 2b forcibly fixes the inputted clock 20 to "L" and outputs it to the no clock detecting circuit 18.

If the no clock detecting circuit 18 is operating normally, the no clock detecting circuit 18 judges that the inputted clock is not received and outputs the no clock alarm signal 22a.

Therefore, monitoring the no clock alarm signal 22a at the normal operation state and at the test state respectively, the control portion 4 can carry out the operation test of the no dock detecting circuit 18. In other words, in a state of the normal operation where the no clock alarm signal 22a is not outputted, it could be judged whether the operation of the no clock detecting circuit 18 is normal or abnormal as below. That is, the operation of the no clock detecting circuit 18 is assumed normal if the no clock alarm signal 22a is outputted while the test is carried out, and operation of the no clock detecting circuit 18 is assumed abnormal if the no clock alarm signal 22a is not outputted while the test is carried out.

The multiplexing circuit 15a multiplexes the test control signal 9a outputted from the control portion 4 to the fault detecting circuit 3, and the no clock detecting circuit test control signal 21a outputted from the control portion 4 to the no clock detecting circuit 18, and outputs the multiplexed result as a multiplexed test control signal 23. This multiplexing makes it possible to combine the signals into one physical signal line even though there are a plurality of kinds of signals. The demultiplexing circuit 16a arranged inside of a transmission path signal synchronization board 25 demultiplexes the multiplexed test control signal 23 to the test control signal 9b and the no clock detecting circuit test control signal 21b and supplies them to the fault forcibly generating circuits 2a and 2b, respectively.

Further, the multiplexing circuit 15b multiplexes the step-out alarm 8a received from the fault detecting circuit 3, and a no clock alarm signal 22a received from the no clock detecting circuit 18 to output the result as a multiplexed alarm signal 24. This multiplexing makes it possible to combine the signals into one physical signal line even though there are a plurality of kinds of signals. The multiplexed alarm signal 24 is outputted from the transmission path signal synchronization board 25 to the demultiplexing circuit 16b. The demultiplexing circuit 16b demultiplexes the multiplexed alarm signal 24 into a step-out alarm 8b and the no clock alarm signal 22b. The step-out alarm 8b and the no clock alarm signal 22b are monitored respectively by the control portion 4.

In this way, the multiplexing circuit 15a and the demultiplexing circuit 16a, and the multiplexing circuit 15b and the demultiplexing circuit 16b test the fault detecting circuit 3 and the no clock detecting circuit 18, respectively or simultaneously. Even in case the check points increase, the number of signal lines does not change physically except only the multiplexed information being increased, and the signal lines are only the multiplexed test control signal 23 and the multiplexed alarm signal 24. Therefore, the test can be carried out without increasing the numbers of the control signal lines and monitoring signal lines.

Embodiment 3

Figure 4:
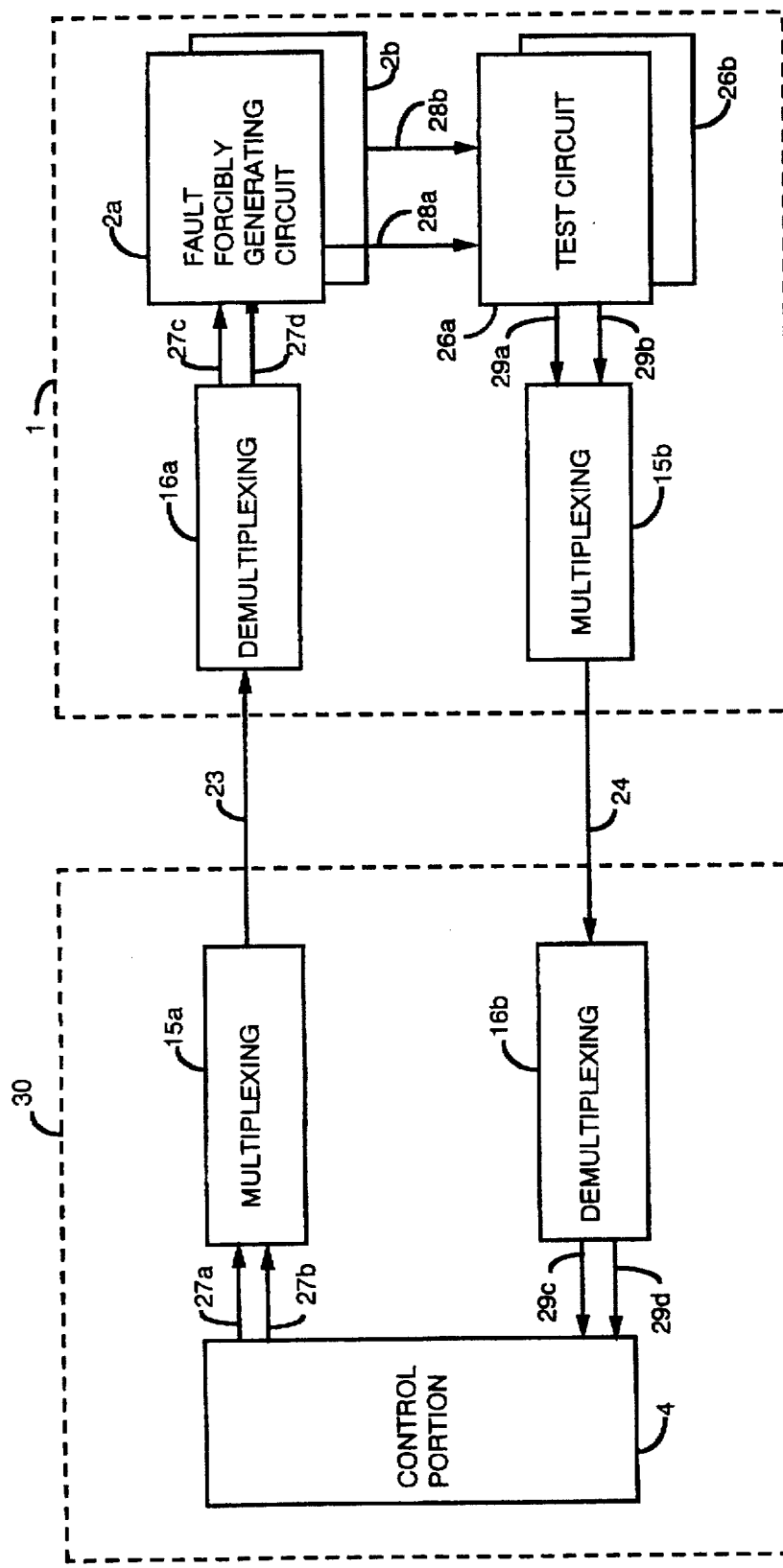
FIG. 4 is a construction of the transmission path terminating device showing other embodiment of the present invention.

FIG. 4 is a construction of a transmission path terminating device showing a third embodiment of the present invention. Elements commonly numbered in FIG. 1 and FIG. 3 are not provided with a detailed explanation here. Those elements are described above in connection with FIG. 4. In FIG. 4, a testing apparatus 30 comprises a control portion 4, a multiplexing circuit 15a and a demultiplexing circuit 16b. The multiplexing circuit 15a multiplexes test control signals 27a and 27b and transmits these signals as a multiplexed test control signal 23 to a transmission path terminating device 1, in case of testing of the operations of a plurality of test circuits 26a and 26b in a transmission path terminating device 1. A demultiplexing circuit 16a is arranged in the transmission path terminating device 1, receives the multiplexed test control signal 23, demultiplexes the multiplexed test control signal 23 to test control signals 27c and 27d, and outputs the signals to the fault forcibly generating circuits 2a and 2b. The fault forcibly generating circuits 2a and 2b generate fault signals 28a and 28b, according to the test control signals 27c and 27d, and outputs these signals 28a and 28b to the test circuits 26a and 26b in order to test these circuits 26a and 26b. A multiplexing circuit 15b multiplexes alarm signals 29a and 29b which are results from the test circuits 26a and 26b, and transmit the alarm signals 29a and 29b to the demultiplexing circuit 16b in the testing apparatus 30 as a multiplexed alarm signal 24. The demultiplexing circuit 16b demultiplexes the inputted multiplexed alarm signal 24 to alarm signals 29c and 29d and outputs them to the control portion 4.

Next, an operation of the transmission path terminating device shown in FIG. 4 is explained below.

In case of testing the operation of a plurality of test circuits 26a and 26b in the transmission path terminating device 1, the multiplexing circuit 15a in the testing apparatus 30 multiplexes the test control signals 27a and 27b received from the control portion 4, and outputs them as a multiplexed test control signal 23 to the transmission path terminating device 1. In the transmission path terminating device 1, the demultiplexing circuit 16a receives the multiplexed test control signal 23, demultiplexes the received signal 23 to test control signals 27c and 27d, and outputs these signals 27c and 27d to the fault forcibly generating circuits 2a and 2b, respectively. The fault forcibly generating circuits 2a and 2b test the test circuits 26a and 26b according to these test control signals 27c and 27d. The test circuits 26a and 26b outputs the alarm signals 29a and 29b, respectively, which are results of the test. The multiplexing circuit 15b multiplexes these alarm signals 29a and 29b to provide a multiplexed alarm signal 24 and outputs them to the demultiplexing circuit 16b in the testing apparatus 30. In the testing apparatus 30, the demultiplexing circuit 16b demultiplexes the inputted multiplexed alarm signal 24 into alarm signals 29c and 29d again, and the control portion 4 monitors these alarm signals 29c and 29d.

In the second embodiment, the number of the testing apparatus 30 is required to be the same as the number of the transmission path terminating device 1. However, according to the third embodiment of the present invention, the testing apparatus 30 can be connected only when the test of the transmission path terminating device 1 is carried out. Therefore, the number of the testing apparatus 30 can be less than that of the transmission path terminating device 1. Accordingly, the circuit scale of transmission path terminating device could be reduced less than the second embodiment.

Embodiment 4

Figure 5:
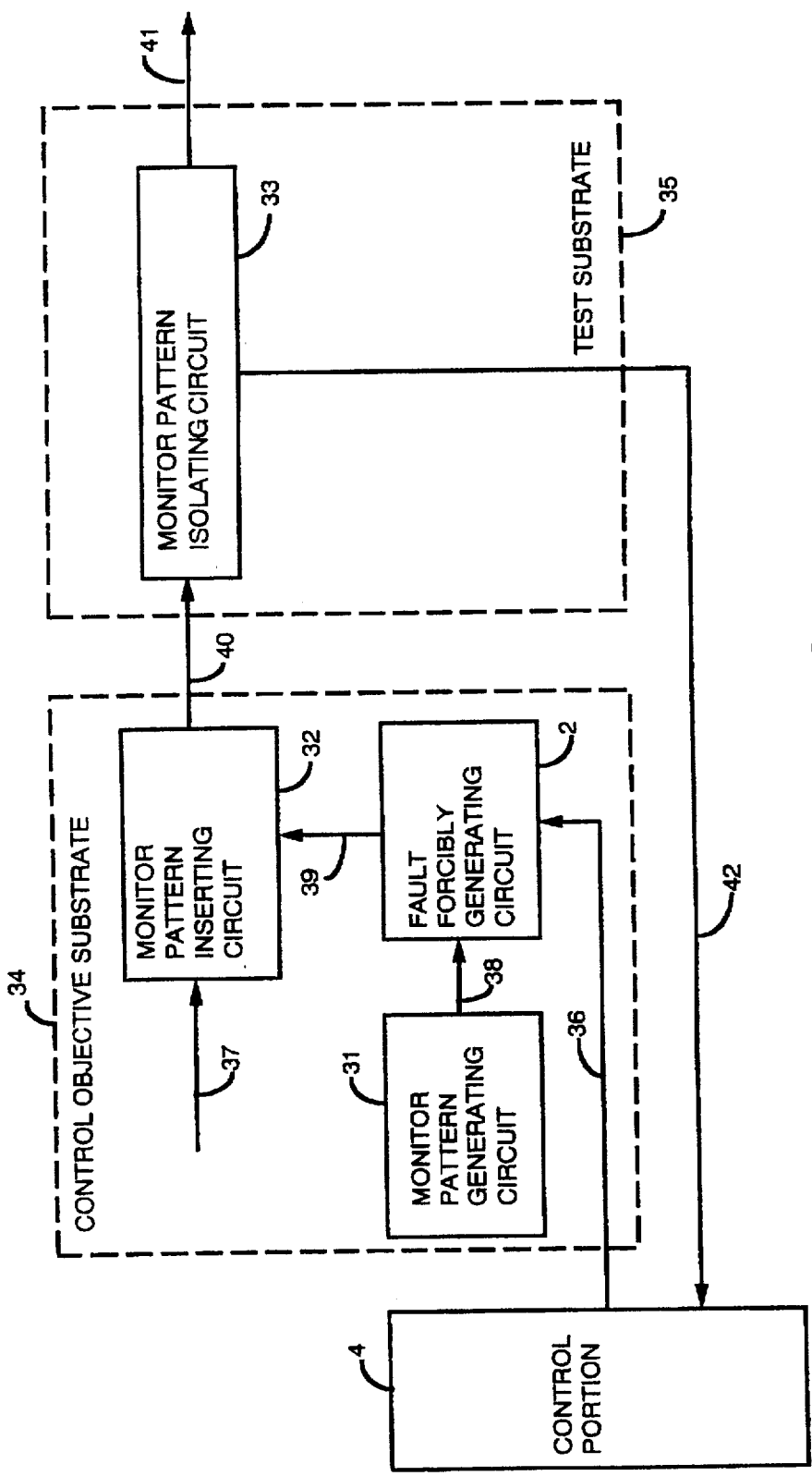
FIG. 5 is a construction of the transmission path terminating device showing other embodiment of the present invention.

FIG. 5 is a construction of a transmission path terminating device showing other embodiment of the present invention. The elements having the same reference numbers in FIG. 5 are the same portions or the corresponding portions in FIG. 1. The transmission path terminating device comprises a control objective board 34, a test board 35. The control objective board 34 comprises a monitor pattern generating circuit 31 for generating a monitor pattern 38, a monitor pattern inserting circuit 32 for inserting a monitor pattern 39 outputted from a fault forcibly generating circuit 2 into a main signal 37. The monitor pattern inserting circuit 32 outputs a monitor pattern insertion main signal 40 and transmits it to the monitor pattern isolating circuit 33 in the test board 35.

The monitor pattern isolating circuit 33 is arranged in the test board 35, separates this particular monitor pattern 39 from the monitor pattern insertion main signal 40 received from the control objective board 34 and outputs a monitor pattern isolation main signal 41. The monitor pattern isolating circuit 33 further generates a monitor pattern abnormal alarm 42 which shows the monitor pattern 39 is abnormal, when the monitor pattern becomes abnormal because of the abnormal state between the monitor pattern inserting circuit 32 and the monitor pattern isolating circuit 33.

Next, an operation of the transmission path terminating device shown in FIG. 5 is explained below. In a usual operation when the test is not carried out, the control portion 4 outputs an "L" level of a monitor pattern control signal 36 to the fault forcibly generating circuit 2. Thereby, the fault forcibly generating circuit 2 lets a monitor pattern 38 outputted from the monitor pattern generating circuit 31 to pass through as it is to the monitor pattern inserting circuit 32.

Figure 6:
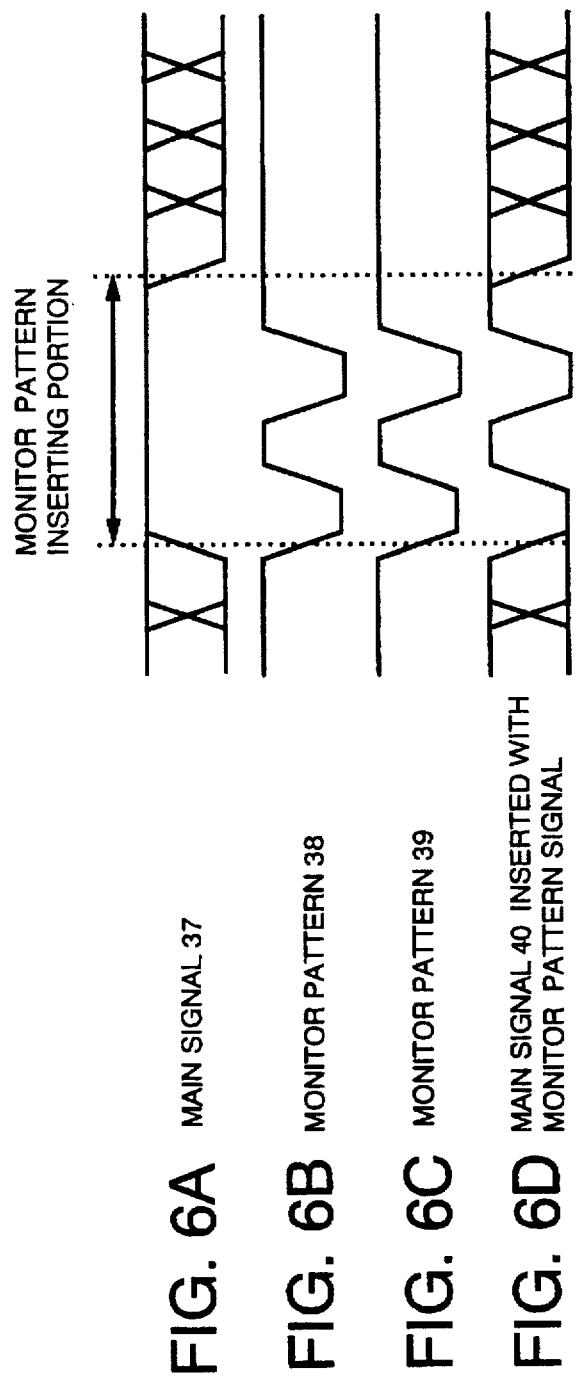
FIGS. 6A–6D are timing charts showing an operation of the transmission path terminating device shown in FIG. 5 in case of not testing an operation of a monitor pattern isolating circuit.

FIGS. 6A–6D are timing charts showing this operation. The above mentioned operation is explained referring to FIGS. 6A–6D. When the main signal 37 and the monitor pattern 38 shown in FIGS. 6A, B are given, the monitor pattern control signal 36 is "L" level during the usual operation when the test is not carried out. Therefore, the monitor pattern 39 becomes the same signal pattern as the monitor pattern 38 as shown in FIG. 6C. Accordingly, the monitor pattern insertion main signal 40 is the same pattern as the main signal 37 in which the monitor pattern 38 is inserted during the monitor pattern insertion portion as shown in FIG. 6D. Then, if the operation between the monitor pattern inserting circuit 32 and the monitor pattern isolating circuit 33 is normal, the monitor pattern isolating circuit 33 detects a normal monitor pattern. Therefore, the monitor pattern abnormal alarm 42 is not outputted.

When testing the operation of the monitor pattern isolating circuit 33, the control portion 4 outputs an "H" level of the monitor pattern control signal 36. The fault forcibly generating circuit 2 fixes forcibly the inputted monitor pattern 38 to "L" level and outputs it to the monitor pattern inserting circuit 32.

Figure 7:
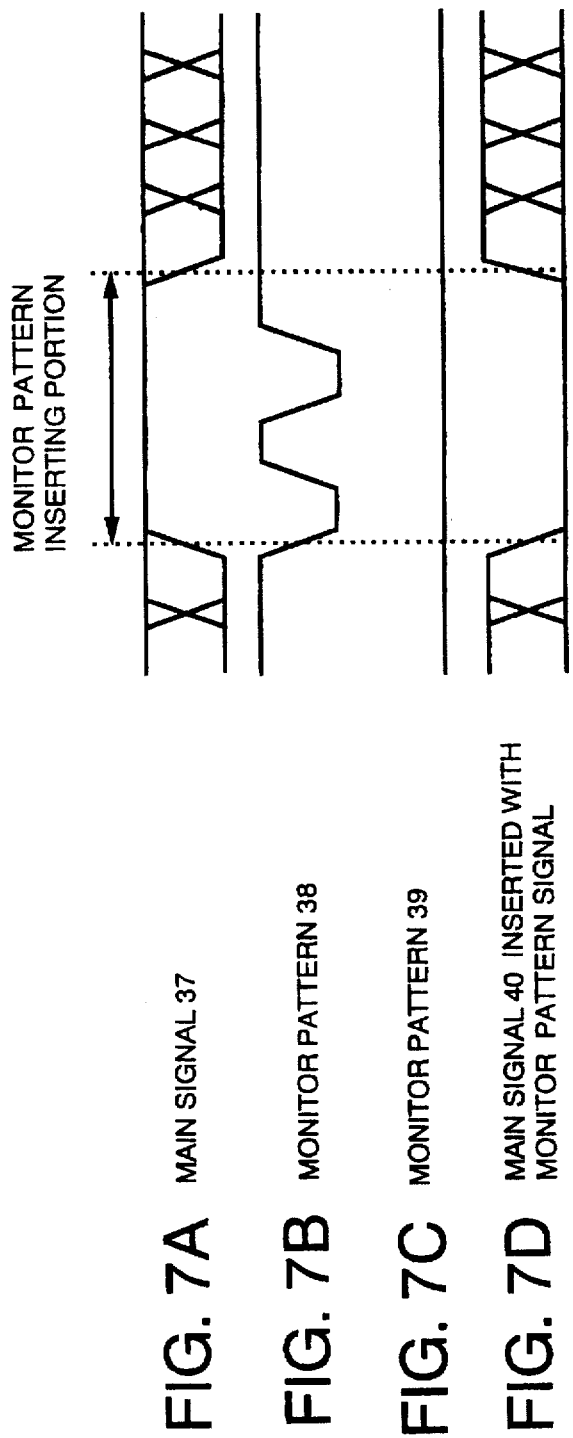
FIGS. 7A–7D are timing charts showing an operation of the transmission path terminating device shown in FIG. 5 in case of testing an operation of a monitor pattern isolating circuit.
Figure 8:
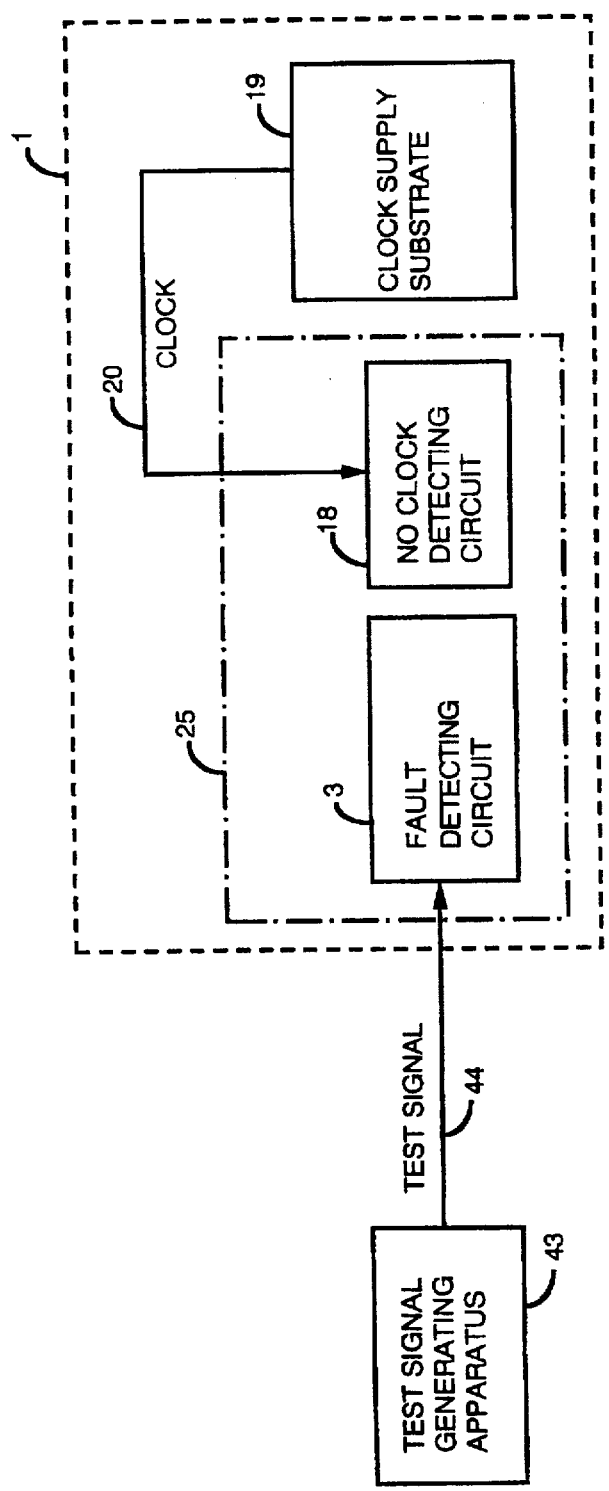
FIG. 8 is a conventional construction of a fault detecting circuit test system for testing an operation of a fault detecting circuit which detects the fault of an input signal.

FIGS. 7A–7D are timing charts showing this operation. The above mentioned operation is explained referring to FIGS. 7A–7D. In case of testing the operation of the monitor pattern isolating circuit 33, since the monitor pattern control signal 36 from the control portion 4 is "H" level, the monitor pattern 39 is fixed in "L" level as shown in FIG. 7C. Accordingly, a pattern which is different from the original monitor pattern 38 is inserted into the main signal 37 by the monitor pattern inserting circuit 32. Therefore, the monitor pattern insertion main signal 40 outputted from the monitor pattern inserting circuit 32 is fixed to "L" level during a monitor pattern insertion portion as shown in FIG. 7D. Then, if the monitor pattern isolating circuit 33 is in a normal operation, the monitor pattern isolating circuit 33 can not detect a normal monitor pattern. Therefore, the monitor pattern abnormal alarm 42 is outputted.

Accordingly, the control portion 4 monitors the operation of the monitor pattern abnormal alarm 42 during the normal operation state and at the test state respectively, to test of the operation of the monitor pattern isolating circuit 33. In other words, when the monitor pattern abnormal alarm 42 is not outputted at the normal operation state, the operation of the monitor pattern isolating circuit 33 is judged to be normal if the monitor pattern abnormal alarm 42 is outputted during the test, and the monitor pattern isolating circuit 33 is judged to be abnormal if the monitor pattern abnormal alarm 42 is not outputted during the test.

According to the fourth embodiment, since a test control objective board 34 comprising a fault forcibly generating circuit 2 outputs signals to the test board 35, it is possible to test the fault detecting circuit without controlling directly the test board having a fault detecting circuit.

Further, since the control portion 4 can be used only during the test, the number of the control portion 4 can be reduced to a number less than that of the pairs of the test control objective board 34 and the test board 35.

Needless to say that it is possible to provide the control portion with a multiplexing circuit for multiplexing test control signals and a demultiplexing circuit for demultiplexing multiplexed test results from the fault detecting circuit, also to provide the above mentioned test control objective board with a demultiplexing circuit for demultiplexing the multiplexed test control signals from the above mentioned control portion, and further to provide the above mentioned test board with a multiplexing circuit for multiplexing the test results from a plurality of fault detecting circuits.

What is claimed is:

1. A system for testing a fault detecting means for detecting faults of an input signal and faults of operations of an apparatus comprising:

a control means for generating a test control signal;

a test board having a fault detecting means for being tested;

a fault forcibly generating means included in said test board for forcibly inserts fault information into a test signal inputted into said fault detecting means according to said test control signal;

wherein said control means carries out a test of an operation of said fault detecting means by monitoring the detection results from said fault detecting means during inserting said fault information into said test signal.

2. The system for testing a fault detecting means according to claim 1, wherein said control means comprises a multiplexing means for multiplexing said test control signals and a demultiplexing means for demultiplexing multiplexed test results from the test board, and wherein said test board comprises a demultiplexing means for demultiplexing multiplexed test control signals from said control means and a multiplexing means for multiplexing test results from a plurality of fault detecting means.

3. The system for testing a fault detecting means according to claim 2 further comprising:

a second fault forcibly generating circuit which prevents a clock to pass through and forcibly generates a fault signal during the test.

a no clock detecting circuit for monitoring a state of the clock from the clock supply board and generating a no clock alarm signal when the clock stops.

4. The system for testing a fault detecting means according to claim 2, wherein a testing apparatus having said control means is provided outside of said test board having a fault detecting means.

5. The system for testing a fault detecting means according to claim 4, wherein said testing apparatus further comprising:

a multiplexing circuit for multiplexing test control signals from the control means and transmits these signals as a multiplexed test control signal to a transmission path terminating device;

a demultiplexing circuit for demultiplexing an inputted multiplexed alarm signal to alarm signals and outputting them to the control portion.

6. The system for testing a fault detecting means according to claim 1 or claim 5, wherein said transmission path terminating device comprising:

a demultiplexing circuit for demultiplexing the multiplexed test control signal to test control signals;

a plurality of fault forcibly generating circuits for generating fault signals according to the test control signals;

a plurality of test circuits for outputting alarm signals which are results of the test;

a multiplexing circuit for multiplexing the alarm signals to a multiplexed alarm signal sent to the demultiplexing circuit in the testing apparatus.

7. A system for testing a fault detecting means for detecting faults of an input signal and faults of operations of an apparatus comprising:

a control means for generating a test control signal;

a test board having a monitor pattern isolating circuit being tested; and a test control objective board comprising:

a monitor pattern generating circuit for generating a monitor pattern;

a fault forcibly generating means for outputting said monitor pattern as it is to the monitor pattern inserting circuit when a monitor pattern control signal is "L" level, and outputting "L" level signal to the monitor pattern inserting circuit when a monitor pattern control signal is "H" level; and a monitor pattern inserting circuit for inserting a monitor pattern or "L" level signal outputted from said fault forcibly generating circuit into a main signal;

wherein said control means carries out a test of an operation of said monitor pattern isolating circuit by monitoring the fault detection results from said monitor pattern isolating circuit during inserting forcibly said monitor pattern into said test signal.

8. The system for testing a monitor pattern isolating circuit according to claim 7, wherein said control means comprises a multiplexing means for multiplexing said test control signals and a demultiplexing means for demultiplexing multiplexed test results from said test board, said control objective board comprises a demultiplexing means for demultiplexing multiplexed test control signals from said control means, and said test board comprises a multiplexing means for multiplexing test results from a plurality of said fault detecting means.

9. The system for testing a monitor pattern isolating circuit according to claim 8, wherein, a testing apparatus including said control means is provided outside of said test board including a monitor pattern isolating circuit.

* * * * *